United States Patent
Shur et al.

(10) Patent No.: US 9,646,911 B2
(45) Date of Patent: May 9, 2017

(54) COMPOSITE SUBSTRATE

(71) Applicant: Sensor Electronic Technology, Inc., Columbia, SC (US)

(72) Inventors: Michael Shur, Latham, NY (US); Maxim S. Shatalov, Columbia, SC (US); Alexander Dobrinsky, Loudonville, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/683,177

(22) Filed: Apr. 10, 2015

(65) Prior Publication Data
US 2015/0295127 A1    Oct. 15, 2015

Related U.S. Application Data (60) Provisional application No. 61/978,184, filed on Apr. 10, 2014, provisional application No. 61/978,185, filed on Apr. 10, 2014.

(51) Int. Cl.
*H01L 21/02* (2006.01)
*H01L 23/367* (2006.01)
(Continued)

(52) U.S. Cl.
CPC ........ *H01L 23/367* (2013.01); *H01L 21/0254* (2013.01); *H01L 21/02428* (2013.01); *H01L 21/4871* (2013.01); *H01L 21/76251* (2013.01); *H01L 23/3732* (2013.01); *H01L 23/3736* (2013.01); *H01L 33/641* (2013.01); *H01L 33/642* (2013.01); *H01L 29/0676* (2013.01); *H01L 29/2003* (2013.01); *H01L 29/7786* (2013.01); *H01L 33/007* (2013.01);
(Continued)

(58) Field of Classification Search
None
See application file for complete search history.

(56) References Cited

U.S. PATENT DOCUMENTS

| | | | |
|---|---|---|---|
| 5,313,094 A | 5/1994 | Beyer et al. | |
| 5,324,987 A | 6/1994 | Iacovangelo et al. | |

(Continued)

OTHER PUBLICATIONS

Choi, S., International Application No. PCT/US2015/025228, International Search Report and Written Opinion, Jul. 31, 2015, 7 pages.

(Continued)

*Primary Examiner* — Charles Garber
*Assistant Examiner* — Alia Sabur
(74) *Attorney, Agent, or Firm* — LaBatt, LLC (57) ABSTRACT

A composite substrate configured for epitaxial growth of a semiconductor layer thereon is provided. The composite substrate includes multiple substrate layers formed of different materials having different thermal expansion coefficients. The thermal expansion coefficient of the material of the semiconductor layer can be between the thermal coefficients of the substrate layer materials. The composite substrate can have a composite thermal expansion coefficient configured to reduce an amount of tensile stress within the semiconductor layer at room temperature and/or an operating temperature for a device fabricated using the heterostructure.

19 Claims, 4 Drawing Sheets

(51) Int. Cl.
    *H01L 21/762* (2006.01)
    *H01L 21/48* (2006.01)
    *H01L 23/373* (2006.01)
    *H01L 33/64* (2010.01)
    *H01L 29/20* (2006.01)
    *H01L 29/778* (2006.01)
    *H01L 29/06* (2006.01)
    *H01L 33/00* (2010.01)

(52) U.S. Cl.
    CPC .. *H01L 33/0079* (2013.01); *H01L 2924/0002* (2013.01); *H01L 2933/0075* (2013.01)

(56) References Cited

U.S. PATENT DOCUMENTS

| | | | |
|---|---|---|---|
| 6,060,785 A * | 5/2000 | New | G03F 9/7076 257/431 |
| 6,328,796 B1 | 12/2001 | Kub et al. | |
| 6,838,702 B1 | 1/2005 | Ho | |
| 8,349,742 B2 | 1/2013 | Tu et al. | |
| 8,981,403 B2 | 3/2015 | Shatalov et al. | |
| 2002/0096106 A1 * | 7/2002 | Kub | H01L 21/2007 117/94 |
| 2003/0033974 A1 * | 2/2003 | Ueda | C30B 25/18 117/84 |
| 2005/0059238 A1 | 3/2005 | Chen et al. | |
| 2005/0230699 A1 | 10/2005 | Wu et al. | |
| 2006/0220036 A1 | 10/2006 | Lee et al. | |
| 2007/0069222 A1 | 3/2007 | Ko et al. | |
| 2011/0094668 A1 * | 4/2011 | Le Vaillant | C30B 25/18 156/249 |
| 2012/0104355 A1 | 5/2012 | Grandusky et al. | |
| 2013/0032835 A1 | 2/2013 | Shatalov et al. | |
| 2013/0056745 A1 | 3/2013 | Chen | |
| 2013/0075781 A1 | 3/2013 | Chen | |
| 2013/0181327 A1 | 7/2013 | Miyoshi et al. | |
| 2014/0001486 A1 | 1/2014 | Bougrov et al. | |
| 2014/0042593 A1 | 2/2014 | Mauder et al. | |
| 2014/0077224 A1 | 3/2014 | Li et al. | |
| 2015/0295155 A1 | 10/2015 | Shur et al. | |

OTHER PUBLICATIONS

Sabur, A., U.S. Appl. No. 14/683,184, Office Action 1, Apr. 21, 2016, 23 pages.
Sabur, A., U.S. Appl. No. 14/683,184, Final Office Action 1, Oct. 31, 2016, 15 pages.
Sabur, A., U.S. Appl. No. 14/683,184, Notice of Allowance, Feb. 7, 2017, 12 pages.

* cited by examiner

COMPOSITE SUBSTRATE

REFERENCE TO RELATED APPLICATIONS

The current application claims the benefit of U.S. Provisional Application Nos. 61/978,184 and 61/978,185, both of which were filed on 10 Apr. 2014, and both of which are hereby incorporated by reference.

TECHNICAL FIELD

The disclosure relates generally to substrates, and more particularly, to a composite substrate configured for improved epitaxial growth of semiconductor layers thereon.

BACKGROUND ART

In epitaxial growth of semiconductor structures and devices, a substrate is needed on which the growth of the semiconductor material is initiated, and which serves as a support for the grown semiconductor layers. The properties of the substrate play a key role in the quality of the epitaxially grown semiconductor layers. For example, a lattice mismatch between the substrate and the semiconductor material epitaxially grown thereon causes stresses and can result in formation of dislocations in the semiconductor material. The dislocations can significantly deteriorate the performance of a semiconductor device, e.g. a light emitting diode (LED), formed on the substrate. Additionally, a difference in the thermal expansion coefficient between the substrate and the epitaxially grown layers can induce stresses in the semiconductor layers. Finally, a substrate can be used for efficient thermal management of the device provided that the substrate has an overall low thermal resistance. Thus, most preferably, the substrate should be formed of the same material to be grown epitaxially thereon. A situation in which the substrate and the epitaxially grown layers are of the same material is referred to as homoepitaxy.

Unfortunately, some widely used compound semiconductor materials such as, for example, gallium nitride (GaN) and other group III nitrides, have significant problems in their bulk fabrication. Production of bulk material in the form of single-crystal wafers can be so challenging and expensive that it is not suitable for industrial-scale manufacturing. In such cases, heterosubstrates (also known as foreign substrates), i.e., substrates formed of a material different from the material to be epitaxially grown thereon, must be used. However, despite carefully optimizing the substrate material for the actual semiconductor material to be grown, the adverse effects of crystal lattice mismatch and difference in thermal expansion between the heterosubstrate and the material to be grown thereon are difficult, if not impossible, to eliminate entirely. To avoid these undesirable effects, different kinds of semiconductor templates have been developed for epitaxial growth of different materials. Templates are typically multi-layered epitaxial structures adjusted to the heterosubstrate with a cap layer made of a material optimized for later epitaxial growth of the semiconductor device structures. By using such templates, e.g., a GaN device can be grown on a sapphire substrate. Such a template improves the quality of the epitaxial layers but is still not able to sufficiently suppress generation of thermo-mechanical stresses.

SUMMARY OF THE INVENTION

In view of the background, the inventors recognize a need for an effective and/or low cost solution for providing substrates for epitaxial growth of high-quality compound semiconductor layers thereon.

Aspects of the invention provide a composite substrate configured for epitaxial growth of a semiconductor layer thereon. The composite substrate includes multiple substrate layers formed of different materials having different thermal expansion coefficients. The thermal expansion coefficient of the material of the semiconductor layer can be between the thermal coefficients of the substrate layer materials. The composite substrate can have a composite thermal expansion coefficient configured to reduce an amount of tensile stress within the semiconductor layer at room temperature and/or an operating temperature for a device fabricated using the heterostructure.

A first aspect of the invention provides a method of fabricating a heterostructure, the method comprising: obtaining a composite substrate including a plurality of substrate layers, wherein the plurality of substrate layers includes a first substrate layer formed of a first material having a first thermal expansion coefficient and a second substrate layer formed of a second material having a second thermal coefficient different from the first thermal expansion coefficient; epitaxially growing a semiconductor layer having a third thermal expansion coefficient on the composite substrate, wherein the third thermal expansion coefficient is greater than or equal to the first thermal expansion coefficient and smaller than or equal to the second thermal expansion coefficient and wherein a composite thermal expansion coefficient for the composite substrate is selected to reduce an amount of tensile stress within the semiconductor layer at at least one of: room temperature or an operating temperature for a device fabricated using the heterostructure.

A second aspect of the invention provides a method comprising: fabricating a heterostructure for a device, the fabricating including: selecting a material and a thickness for each of a plurality of substrate layers for a composite substrate based on a material of a semiconductor layer to be epitaxially grown on the composite substrate, wherein the selecting includes selecting a first material for a first substrate layer having a first thermal expansion coefficient and a second material for a second substrate layer having a second thermal expansion coefficient different from the first thermal expansion coefficient, wherein a third thermal expansion coefficient of the material of the semiconductor layer is greater than or equal to the first thermal expansion coefficient and smaller than or equal to the second thermal expansion coefficient and wherein a composite thermal expansion coefficient for the composite substrate is configured to reduce an amount of tensile stress within the semiconductor layer at at least one of: room temperature or an operating temperature for a device fabricated using the heterostructure; fabricating the composite substrate including the plurality of substrate layers; and epitaxially growing the semiconductor layer on the composite substrate.

A third aspect of the invention provides a heterostructure including: a composite substrate including a plurality of substrate layers, wherein the plurality of substrate layers includes a first substrate layer formed of a first material having a first thermal expansion coefficient and a second substrate layer formed of a second material having a second thermal expansion coefficient different from the first thermal expansion coefficient; and a semiconductor layer having a third thermal expansion coefficient on the composite substrate epitaxially grown directly on the composite substrate, wherein the third thermal expansion coefficient is greater than or equal to the first thermal expansion coefficient and smaller than or equal to the second thermal expansion coefficient and wherein a composite thermal expansion coefficient for the composite substrate substantially matches a temperature averaged thermal expansion coefficient of the semiconductor film.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a composite substrate configured for epitaxial growth of a semiconductor layer thereon. The composite substrate includes multiple substrate layers formed of different materials having different thermal expansion coefficients. The thermal expansion coefficient of the material of the semiconductor layer can be between the thermal coefficients of the substrate layer materials. The composite substrate can have a composite thermal expansion coefficient configured to reduce an amount of tensile stress within the semiconductor layer at room temperature and/or an operating temperature for a device fabricated using the heterostructure. As used herein, unless otherwise noted, the term "set" means one or more (i.e., at least one) and the phrase "any solution" means any now known or later developed solution.

Figure 1:
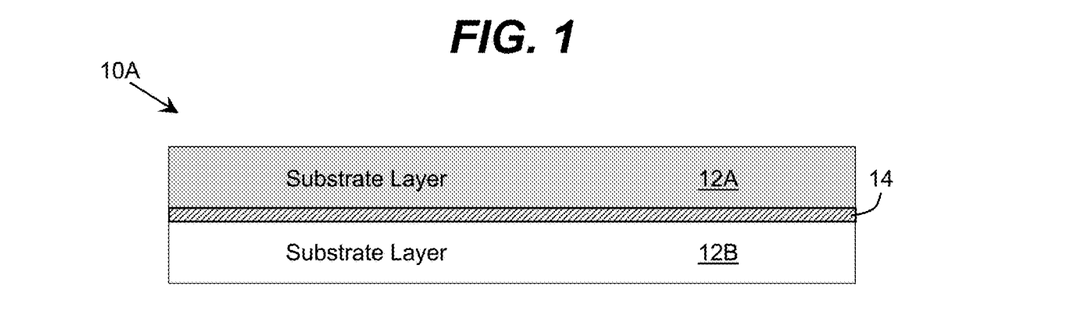
FIG. 1 shows a schematic of an illustrative composite substrate according to an embodiment.
Figure 2:
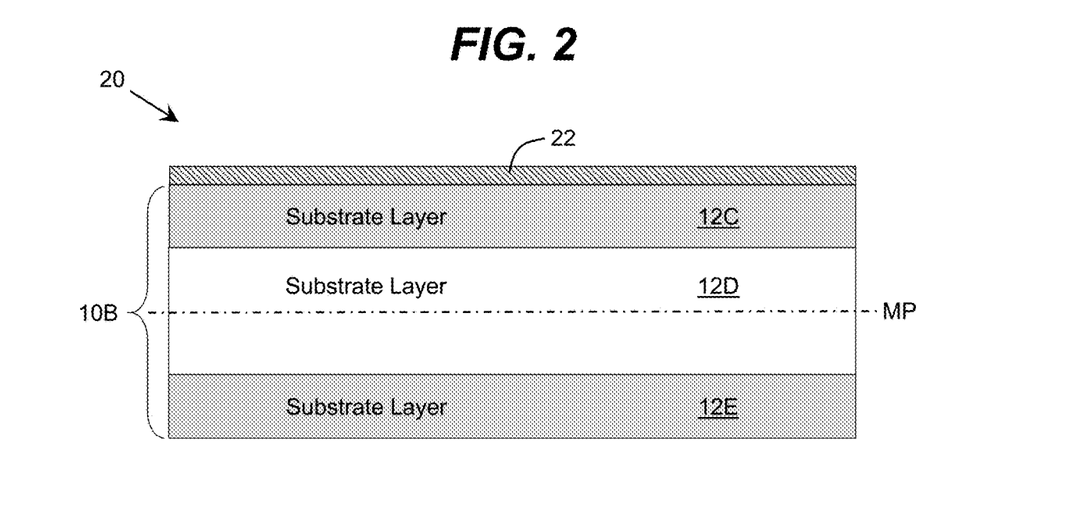
FIG. 2 shows a schematic of an illustrative heterostructure including a composite substrate according to an embodiment.

Turning to the drawings, FIG. 1 shows a schematic of an illustrative composite substrate 10A according to an embodiment, while FIG. 2 shows a schematic of an illustrative heterostructure 20 including a composite substrate 10B according to an embodiment. Referring to FIGS. 1 and 2, as illustrated, each composite substrate 10A, 10B comprises a laminate of multiple substrate layers 12A, 12B and 12C-12E, respectively. Each composite substrate 10A, 10B includes substrate layers 12A-12E of two or more distinct substrate materials. To this extent, for the composite substrate 10A, the substrate layer 12A is formed of a distinct material from the material used to form substrate layer 12B. Similarly, for the composite substrate 10B, each substrate layer 12C-12E can be formed of a distinct material, or at most two of the substrate layers 12C-12E can be formed of the same material.

Two immediately adjacent substrate layers, such as the substrate layers 12A, 12B, can be rigidly attached to one another using any solution. For example, a bonding material 14 can be used to attach the substrate layers 12A, 12B to one another. In this case, the bonding material 14 can be applied to a surface of one or both of the substrate layers 12A, 12B, which can subsequently be pressed together. Any bonding material 14 can be utilized, which can be selected based on the materials of the substrate layers 12A, 12B being bonded using any solution. In an embodiment, the bonding material 14 is silicon dioxide, which is applied between the substrate layers 12A, 12B and the composite substrate 10A can be subsequently heated and/or subjected to elevated pressure. However, it is understood that other suitable bonding materials 14 can be utilized. Regardless, the particular bonding material 14 must be capable of withstanding the growth temperatures utilized for growth of the semiconductor heterostructure.

Additionally, the bonding material 14 can be selected based on one or more attributes of the target device being fabricated using the compound substrate 10A, 10B. For example, when radiation will propagate through the compound substrate 10A, 10B during operation of the target device, the bonding material 14 can be selected to have a refractive index for a target wavelength of radiation that substantially matches the refractive index for the material of one of the substrate layers 12A, 12B. Alternatively, the bonding material 14 can have a refractive index for the target wavelength that is between the refractive indexes for the materials of the substrate layers 12A, 12B, thereby providing a transition between the two refractive indexes. For example, when the substrate layers 12A, 12B have different indexes of refraction, an index of refraction of the bonding material 14 can be approximately equal to a square root of a product of the indexes of refraction of the substrate layers 12A, 12B. An illustrative bonding material 14 comprises a cured polymer film, or the like.

In an embodiment, a composite substrate 10A, 10B includes two or more substrate layers 12A-12E formed of two or more distinct materials such that the material of any substrate layer 12A-12E is distinct from the material of any immediately adjacent substrate layer 12A-12E. In this case, for the composite substrate 10B, the substrate layers 12C, 12E can be formed of the same or dissimilar materials, but the substrate layer 12D will be formed of a material dissimilar from both of the substrate layers 12C, 12E. In a more particular embodiment, a composite substrate comprises a laminate structure that is symmetric about a mid-plane of the composite substrate structure. For example, using the composite substrate 10B as an example, the substrate layers 12C, 12E can be formed of the same materials and have substantially the same thicknesses (e.g., within +/−5%) so that the composite substrate 10B is substantially symmetric about the mid-plane MP. However, it is understood that this is only illustrative, and each substrate layer 12A-12E of a composite substrate 10A, 10B can be formed of a material different from the material(s) used to form every other substrate layer 12A-12E of the composite substrate 10A, 10B.

Each substrate layer 12A-12E can be formed of any type of substrate material typically used for growth of a semiconductor film 22 of a target type of material on the corresponding composite substrate 10A, 10B. For example, when the semiconductor film 22 is a group III-V material (e.g., group III nitride, group III arsenide, and/or the like), illustrative materials for each substrate layer 12A-12E include: sapphire, silicon carbide (SiC), silicon (Si), diamond, bulk AlN, bulk GaN, bulk AlGaN, AlON, $LiNbO_3$, $LiGaO_2$, $GaO_2$, or another suitable material.

The material used for each substrate layer 12A-12E in the corresponding composite substrate 10A, 10B can be selected based on the corresponding thermal and/or mechanical properties of the substrate materials and the material of the semiconductor film(s) 22. For example, such a selection can be configured to reduce epitaxial stresses present in the semiconductor film(s) 22 subsequently epitaxially grown over the composite substrate 10A, 10B.

In an illustrative embodiment, the substrate materials for the substrate layers 12A-12E are selected based on the corresponding biaxial modulus, $E_i$, and/or thermal expansion coefficient, $\alpha_i$, of the substrate materials and the material of the semiconductor film 22. For example, for a semiconductor film 22 having a thermal expansion coefficient, $\alpha_f$, grown over the substrate 10A, the materials for the substrate layers 12A, 12B can be selected such that the corresponding thermal expansion coefficients $\alpha_a$, $\alpha_b$, respectively, satisfy the formula $\alpha_a \leq \alpha_f \leq \alpha_b$. In a more particular embodiment, the materials satisfy the formula $\alpha_a < \alpha_f < \alpha_b$. Regardless, it is understood that epitaxial growth of a semiconductor film can be performed on the surface of either of the substrate layers 12A, 12B. In particular, the substrate layer 12A having the lower thermal expansion coefficient, $\alpha_a$, can be directly adjacent to the epitaxially grown semiconductor film or can be located immediately adjacent to an opposing side of the substrate layer 12B on which the semiconductor film is epitaxially grown. For example, for a semiconductor film grown on a substrate with a lower thermal expansion coefficient, the semiconductor film will experience tensile stresses during cool down, and some of these tensile stresses can be mitigated by the presence of a material with a higher thermal coefficient, $\alpha_b$. Alternatively, for a semiconductor film grown on a substrate with higher thermal expansion coefficient, the semiconductor film will experience compressive stresses during cool down, and some of these compressive stresses can be mitigated by the presence of a material with a lower thermal coefficient, $\alpha_a$.

An appropriately configured composite substrate 10A, 10B can reduce a level of epitaxial thermal stresses in the semiconductor film 22 epitaxially grown thereon. For example, during growth of an aluminum nitride (AlN) film over a silicon carbide (SiC) substrate, the film may exhibit large tensile stresses due to a difference in the thermal expansion coefficient of the AlN film and the SiC substrate and from tensile stress acquired during nucleation and coalescence of the AlN islands. An embodiment of the invention proposes to balance such tensile stresses by providing a composite substrate 10A, 10B having a composite thermal expansion coefficient (e.g., which can be estimated using a weighted average of the thermal expansion coefficients of the corresponding substrate layers 12A-12E thereby accounting for differences in the respective heights of the substrate layers 12A-12E) that is closer to that of the semiconductor film 22 than the thermal expansion coefficient of a substrate formed of a single layer of substrate material as used in the prior art.

For example, considering growth of the AlN film over a composite substrate 10A as an illustrative example, in an embodiment, the composite substrate 10A is configured with a SiC substrate layer 10A, which has a thermal expansion coefficient that is lower than that of the AlN film, rigidly attached to a substrate layer 10B formed of a material having a thermal expansion coefficient that is higher than that of the AlN film. In a more particular illustrative embodiment, the substrate layer 10B is formed of sapphire. In this manner, a composite thermal expansion coefficient of the composite substrate 10A can be configured to be closer to and/or substantially equal to that of the semiconductor film 22, e.g., AlN. Epitaxial growth of the AlN film can be performed directly on a surface of either or both of the substrate layers 10A, 10B. For growth on only one of the substrate layers 10A, 10B, the particular substrate layer 10A, 10B on which growth is performed can be selected based on the corresponding application for the heterostructure 20 using any solution. For example, the substrate layer 10A, 10B can be selected based on one or more of: consideration of stresses during growth, suitability for growth of the semiconductor material, functionality provided during operation of the device (e.g., lower temperature, light extraction, etc.), and/or the like.

During use of the composite substrate 10A for growth of one or more semiconductor films 22 thereon, the composite substrate 10A may deform (e.g., bow or buckle) during heating. To this extent, in an embodiment, a composite substrate 10B designed to withstand bowing and/or buckling can be utilized. In an illustrative embodiment, the composite substrate 10B includes three or more substrate layers 12C-12E, which are selected to reduce or eliminate bowing and/or buckling when heated. For example, the substrate layers 12C, 12E can be selected to have substantially the same thermal expansion coefficient and/or substantially the same thickness (e.g., the substrate layers 12C, 12E can be formed of the same material having the same thickness). In this case, the substrate layers 12C, 12E will create forces with opposite signs of strain during heating, thereby reducing or even eliminating bowing of the heterostructure 20. Furthermore, a thickness of one of the substrate layers 12C-12E can be modified to balance additional stresses created by the semiconductor film 22 to further reduce and/or eliminate buckling of the heterostructure 20 at room temperature. For example, the thickness of a substrate layer 12C-12E can be selected to provide optimal strains, optimal bowing, and/or the like. Consider silicon carbide and sapphire as illustrative substrate layers with a group III nitride semiconductor film 22 epitaxially grown directly on the silicon carbide. At room temperature, the silicon carbide has a compressive stress due to the presence of the semiconductor film 22 and the sapphire has a tensile stress. By adjusting a relative thickness of these layers, an amount of tensile/compressive stress present in the semiconductor film 22 can be adjusted. For example, for a semiconductor film 22 experiencing tensile stress at room temperature, such as aluminum nitride, the thickness of the sapphire layer can be larger than the thickness of the silicon carbide layer to reduce the tensile stress in the semiconductor film 22.

In addition to controlling deformation, an embodiment of a composite substrate 10A, 10B can be configured to manage tensile stresses during growth of the semiconductor film(s) 22. For example, consider tensile stresses, $\sigma_f$, created within the epitaxially grown semiconductor film 22 during growth (e.g., by coalescence of small nucleation islands). These tensile stresses can be at least partly balanced by managing thermal stresses present in the semiconductor film 22 after the growth due to a difference in the thermal expansion coefficients of the semiconductor film 22 and the composite substrate 10A, 10B. These thermal stresses can be calculated by: $\sigma_T = E_e(\alpha_e - \alpha_c)\Delta T$, where $E_e$ is the biaxial modulus for the semiconductor film 22; $\alpha_e$ is the thermal expansion coefficient for the semiconductor film 22; $\alpha_c$ is the thermal expansion coefficient for the composite substrate 10A, 10B; and $\Delta T$ is the temperature difference between the growth temperature (e.g., at the start of growth) and room temperature; and where $\sigma_T < 0$ indicates compressive stresses and $\sigma_T > 0$ indicates tensile stresses.

In an embodiment, in order to manage stresses within the epitaxial film 22, the heterostructure 20 can be configured such that:

$$\sigma_f + \sigma_T = \sigma_f + E_e(\alpha_e - \alpha_c)\Delta T \to 0.$$

This equation can be used to calculate the thermal expansion coefficient for the composite substrate 10A, 10B as:

$$\alpha_c = \frac{\sigma_f + E_e \alpha_e \Delta T}{E_e \Delta T}$$

As indicated by this equation, with a lack of tensile stresses $\sigma_f$, $\alpha_c = \alpha_e$.

Considering a composite substrate 10A with two substrate layers 12A, 12B, a total force per unit length can be calculated as: $\sigma_1 h_1 + \sigma_2 h_2 = 0$, where $\sigma_1$ and $\sigma_2$ are the thermal stresses of each of the substrate layers 12A, 12B and $h_1$ and $h_2$ are the thicknesses of each of the substrate layers 12A, 12B. The thermal stress for a given substrate layer 12A, 12B, $\sigma_i$, can be calculated as: $\sigma_i = E_i(\epsilon - \alpha_i \Delta T)$, where $\epsilon$ is a strain of the composite substrate 10A and can be calculated as $$\epsilon = \frac{l + \Delta l}{l},$$

where $l$ is the lateral length of the composite substrate 10A (e.g., the radius of a circular wafer); and $\Delta l$ is the change in length due to the application of stress.

In an embodiment, the composite thermal expansion coefficient can be defined as: $\alpha_c \Delta T = \epsilon$, which means for the composite substrate 10A with two substrate layers 12A, 12B: $E_1(\alpha_c - \alpha_1)h_1 + E_2(\alpha_c - \alpha_2)h_2 = 0$. Using this equation, an expression for the composite thermal expansion coefficient is:

$$\alpha_c = (E_1 \alpha_1 h_1 + E_2 \alpha_2 h_2)/(E_1 h_1 + E_2 h_2).$$

Combining this expression with the expression:

$$\alpha_c = \frac{\sigma_f + E_e \alpha_e \Delta T}{E_e \Delta T}$$

the relative thicknesses of the substrate layers 12A, 12B, $h_1$ and $h_2$, can be deduced for a given set of materials with thermal expansion coefficients, $\alpha_1$ and $\alpha_2$, and biaxial moduli, $E_1$ and $E_2$, to balance (e.g., reduce) a given tension within a semiconductor film 22, $\sigma_f$.

Figure 3:
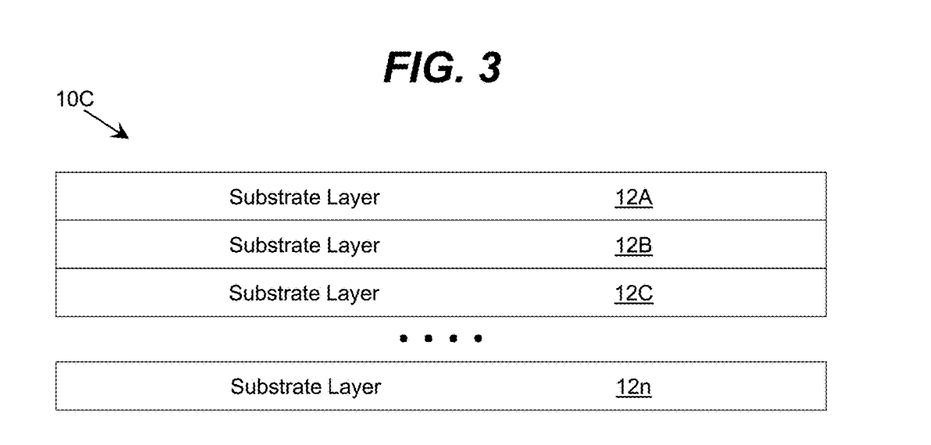
FIG. 3 shows a schematic of an illustrative composite substrate including an arbitrary number of substrate layers according to an embodiment.

The approach described herein for a two layer composite substrate 10A can be readily generalized for a composite substrate having any number of layers with variable thermal and mechanical coefficients. To this extent, FIG. 3 shows a schematic of an illustrative composite substrate 10C including an arbitrary number of (e.g., four or more) substrate layers 12A-12n according to an embodiment. The relative thicknesses of the substrate layers 12A-12n can be selected using an illustrative generalized formula:

$$\sum_i E_i h_i \alpha_c - \sum_i E_i h_i \alpha_i = 0 \to \alpha_c = \frac{\Sigma_i E_i h_i \alpha_i}{\Sigma_i E_i h_i}$$

In an embodiment, a composite substrate 10C including multiple layers 12A-12n can be used for tailoring thermal and/or mechanical properties of the composite substrate 100, e.g., when a thermal expansion coefficient for the semiconductor film 22 (FIG. 2) is a function of the growth temperature. For example, for a composite substrate 100 including n different substrate layers 12A-12n, each of which has different thermal and mechanical properties than one or more of the other substrate layers 12A-12n, a total of n thickness parameters, one for each substrate layer 12A-12n, can be selected. For a situation in which $\alpha_c(T)$ is to be optimized for n different values of temperature (e.g., n different temperatures utilized during growth and/or key temperature points during cooling), utilization of a composite substrate 10C including multiple substrate layers 12A-12n can be beneficial.

In an illustrative embodiment, a composite thermal expansion coefficient for a substrate 10C described herein that varies as a function of temperature in a temperature range between room temperature and/or operating temperature and a highest epitaxial growth temperature is selected to reduce tensile stresses within the epitaxially grown semiconductor film 22 (FIG. 2) when measured at room or operating temperature. In general, optimization of the composite thermal expansion coefficient over a temperature range can be expressed as:

$$\sigma = E(\int_{T_{high}}^{T_{low}} [\alpha_f(T) - \alpha_c(T)]dT),$$

where $\alpha_c(T)$ is chosen to minimize $\sigma$. In an embodiment, the composite thermal expansion coefficient for multiple temperatures spaced in a temperature range between room temperature and a highest epitaxial growth temperature can be selected to substantially match (e.g., within +/−10%) the thermal expansion coefficient $\alpha_f$ of the semiconductor film 22 for each of the corresponding temperatures. Alternatively, the composite thermal expansion coefficient can be selected to substantially match (e.g., within +/−10%) a thermal expansion coefficient $\alpha_f$ of the semiconductor film 22 at room temperature. In each case, selection of the composite thermal expansion coefficient for the composite substrate 10C is subject to a constraint of the composite substrate 10C remaining intact. For example, the composite substrate 10C can be configured to be capable of withstanding stresses generated within the substrate layers 12A-12n without developing a significant amount of (e.g., any) cracks.

Figure 4:
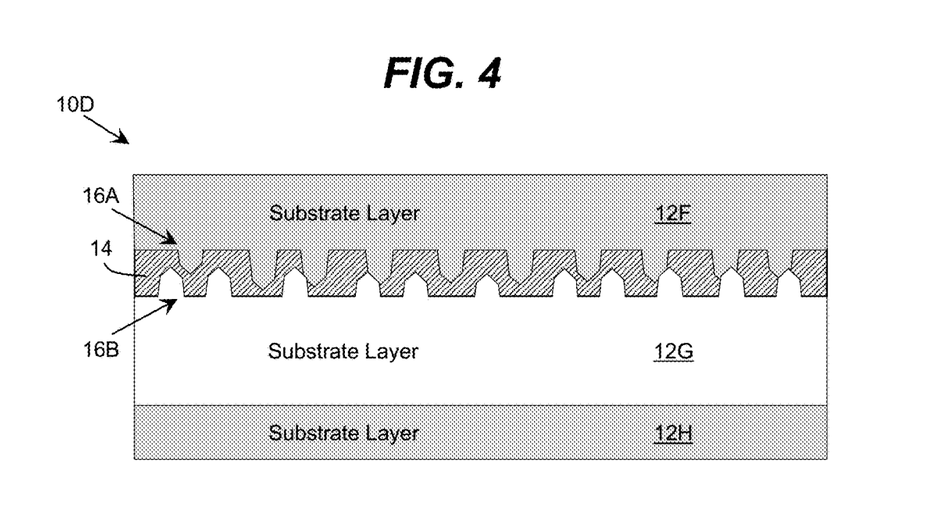
FIG. 4 shows a schematic of an illustrative composite substrate according to an embodiment.

As discussed herein, two substrate layers 12A-12n can be rigidly attached using any solution. For example, a traditional wafer bonding technique can be utilized. Similarly, as shown in FIG. 1, an adhesive 14 can be applied between the surfaces of two substrate layers to be rigidly attached. Additionally, FIG. 4 shows a schematic of an illustrative composite substrate 10D according to an embodiment. In this case, the composite substrate 10D includes three substrate layers 12F-12H, which are rigidly attached to one another in a sequential manner. In this case, the substrate layers 12F, 12G are shown including non-uniform surfaces 16A, 16B (e.g., on the order of 1 to 10 microns), which have been patterned, roughened, and/or the like, and subsequently rigidly attached using an adhesive 14.

The non-uniform surfaces 16A, 16B can be formed using any solution. For example, the non-uniform surfaces 16A, 16B can be formed through substrate etching. In this case, a mask, such as anodized aluminum oxide, can be applied on the surface of the substrate 12F, 12G, with openings where the substrate 12F, 12G is to be etched. After etching is complete, the mask can be removed from the non-uniform surface 16A, 16B of the substrate 12F, 12G using any solution. Alternatively, a mechanical solution, such as sanding the substrate, can be used to roughen the non-uniform surfaces 16A, 16B (e.g., in a non-periodic manner).

The non-uniform surfaces 16A, 16B can be configured to provide one or more benefits. For example, the non-uniform surfaces 16A, 16B can provide a more laterally rigid attachment of the substrate layers 12F, 12G than that provided when the surfaces are substantially uniform. In an embodiment, the non-uniform surfaces 16A, 16B can include openings and pillars, which are substantially aligned with pillars and openings on the other non-uniform surface 16A, 16B to provide a laterally rigid attachment of the two substrate layers 12F, 12G. Additionally, the non-uniform surfaces 16A, 16B can be configured to affect the propagation of radiation through the interface between the substrate layers 12F, 12G. For example, the non-uniform surfaces 16A, 16B can be configured to provide wave guiding of the radiation, e.g., by forming a photonic crystal, and/or the like.

It is understood that the composite substrate 10D and the non-uniform surfaces 16A, 16B are only illustrative of various composite substrates 10D and non-uniform surface(s) 16A, 16B that can be utilized according to the invention. For example, when a composite substrate 10D includes three or more substrate layers 12F-12H, any combination of one or more of the interfaces of the substrate layers 12F-12H can include one or more non-uniform surfaces. Furthermore, the formation of each non-uniform surface 16A, 16B can utilize a similar solution or a different solution than that utilized in the formation of other non-uniform surface(s) 16A, 16B and be configured to provide a distinct set of benefits for the corresponding interface between the substrate layers 12F-12H.

Still further, it is understood that an outer surface of a composite substrate 10A-10D described herein can be patterned using any solution. For example, a surface on which epitaxial growth is to be performed can be patterned in a manner to facilitate growth of a high quality epitaxial film using any solution. Similarly, a surface through which radiation is to be emitted from a corresponding device (e.g., an LED) can be patterned to facilitate more efficient propagation of the radiation from the composite substrate 10A-10D into the surrounding atmosphere.

Figure 5:
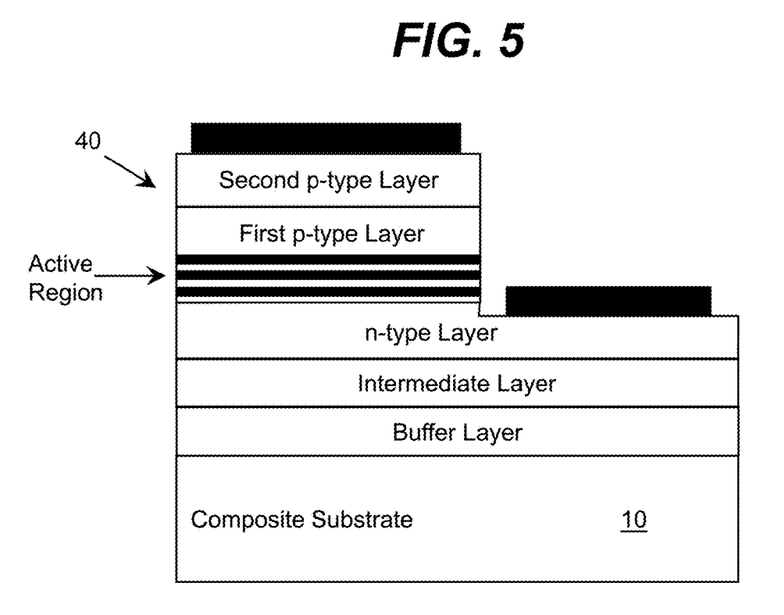
FIG. 5 shows a schematic of an illustrative emitting device according to an embodiment.
Figure 6:
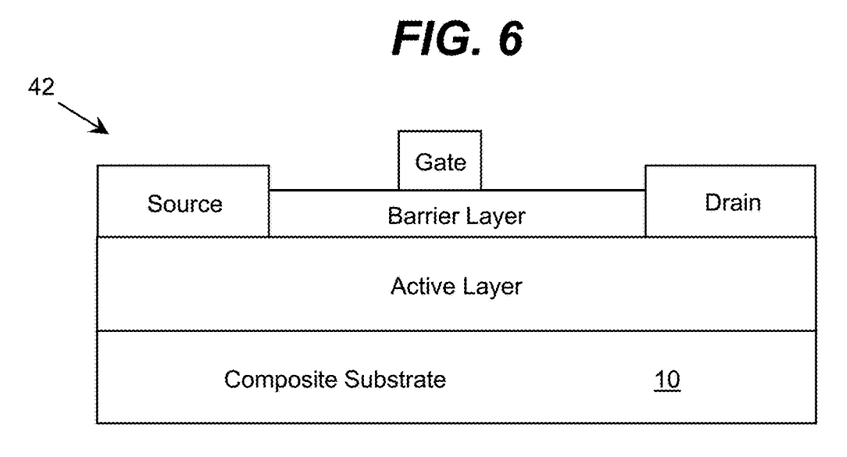
FIG. 6 shows a schematic of an illustrative transistor according to an embodiment.

A composite substrate 10A-10D described herein can be utilized to fabricate any of various types of electronic and optoelectronic devices. In an embodiment, the device is an emitting device, such as an LED, laser diode, and/or the like. To this extent, FIG. 5 shows a schematic of an illustrative emitting device 40 according to an embodiment. In another embodiment, the device is a transistor, such as a field effect transistor, or the like. To this extent, FIG. 6 shows a schematic of an illustrative transistor 42 according to an embodiment. In each case, various layers of the device 40, 42 are epitaxially grown on the composite substrate 10. Subsequently, further processing can be performed to, for example, form contacts, electrodes, and/or the like. It is understood that the layer configurations shown for devices 40, 42 are only illustrative, and embodiments of the devices 40, 42 can include various alternative layer configurations, include additional and/or alternatively configured structures, and/or the like.

Figure 7:
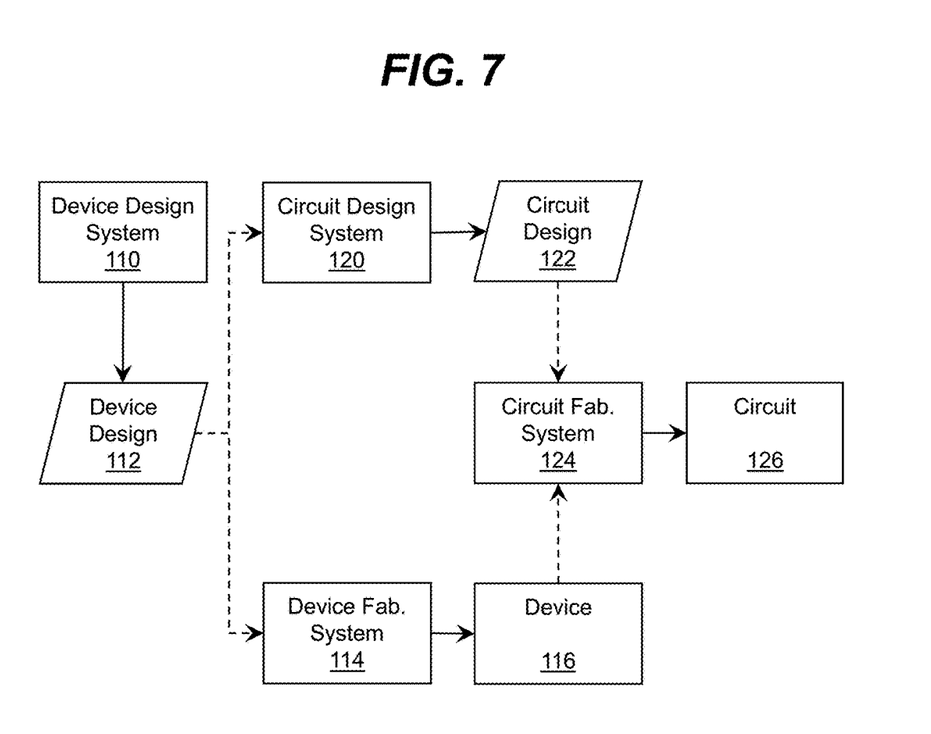
FIG. 7 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 7 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a heterostructure, the method comprising:
   obtaining a composite substrate including a plurality of substrate layers, wherein the plurality of substrate layers includes a first substrate layer formed of a first material having a first thermal expansion coefficient and a second substrate layer formed of a second material having a second thermal expansion coefficient different from the first thermal expansion coefficient, wherein the obtaining includes selecting a relative thickness of each of the plurality of substrate layers according to the following:

$$\sum_i E_i h_i \alpha_c - \sum_i E_i h_i \alpha_i = 0 \rightarrow \alpha_c = \frac{\sum_i E_i h_i \alpha_i}{\sum_i E_i h_i},$$

wherein $E_i$ is a biaxial modulus of a substrate layer, $h_i$ is a thickness of a substrate layer, $a_i$ is the thermal expansion coefficient for a substrate layer, and $a_c$ is a composite thermal expansion coefficient for the composite substrate; and
   epitaxially growing a semiconductor layer having a third thermal expansion coefficient on the composite substrate, wherein the third thermal expansion coefficient is greater than or equal to the first thermal expansion coefficient and smaller than or equal to the second thermal expansion coefficient and wherein the composite thermal expansion coefficient for the composite substrate is selected to reduce an amount of tensile stress within the semiconductor layer at at least one of: room temperature or an operating temperature for a device fabricated using the heterostructure, wherein the composite thermal expansion coefficient for the composite substrate is selected according to the following:

$\sigma = E(\int_{T_{high}}^{T_{low}} [\alpha_f(T) - \alpha_c(T)] dT)$, wherein $\sigma$ is the tensile stress, E is the biaxial modulus of the composite substrate, $T_{low}$ is a temperature measured at a room or an operating temperature, $T_{high}$ is a temperature at a highest epitaxial growth temperature, $\alpha_f(T)$ is a thermal expansion coefficient of the semiconductor layer at a temperature T, $\alpha_c(T)$ is a thermal expansion coefficient of the composite substrate at a temperature T and dT is the difference between $T_{low}$ and $T_{high}$, and wherein $\alpha_c(T)$ is chosen to minimize $\sigma$.

2. The method of claim 1, wherein the obtaining includes rigidly connecting the first substrate layer to the second substrate layer.

3. The method of claim 2, wherein the rigidly connecting includes bonding the first substrate layer to the second substrate layer.

4. The method of claim 2, wherein the rigidly connecting includes at least one of: roughening or etching a surface of at least one of the first substrate layer or the second substrate layer.

5. The method of claim 1, wherein the obtaining includes selecting a material for the first substrate layer and a material for the second substrate layer based on the material of the semiconductor layer.

6. The method of claim 5, wherein the materials are silicon carbide and sapphire.

7. The method of claim 1, wherein the composite thermal expansion coefficient for the composite substrate is selected to substantially match a temperature averaged thermal expansion coefficient of the semiconductor film.

8. A method comprising:
   fabricating a heterostructure for a device, the fabricating including:
   selecting a material and a thickness for each of a plurality of substrate layers for a composite substrate based on a material of a semiconductor layer to be epitaxially grown on the composite substrate, wherein the selecting includes selecting a first material for a first substrate layer having a first thermal expansion coefficient and a second material for a second substrate layer having a second thermal expansion coefficient different from the first thermal expansion coefficient, wherein the selecting the thickness includes selecting a relative thickness of each of the plurality of substrate layers according to the following:

$$\sum_i E_i h_i \alpha_c - \sum_i E_i h_i \alpha_i = 0 \rightarrow \alpha_c = \frac{\sum_i E_i h_i \alpha_i}{\sum_i E_i h_i},$$

wherein
   $E_i$ is a biaxial modulus of a substrate layer, $h_i$ is a thickness of a substrate layer, $a_i$ is the thermal expansion coefficient for a substrate layer, and $a_c$ is a composite thermal expansion coefficient for the composite substrate, wherein a third thermal expansion coefficient of the material of the semiconductor layer is greater than or equal to the first thermal expansion coefficient and smaller than or equal to the second thermal expansion coefficient and wherein the composite thermal expansion coefficient for the composite substrate is configured to reduce an amount of tensile stress within the semiconductor layer at at least one of: room temperature or an operating temperature for a device fabricated using the heterostructure, wherein the composite thermal expansion coefficient for the composite substrate is selected according to the following:

$$\sigma = E(\int_{T_{high}}^{T_{low}} [\alpha_f(T) - \alpha_c(T)] dT), \text{wherin}$$

σ is the tensile stress, E is the biaxial modulus of the composite substrate, $T_{low}$ is a temperature measured at a room or an operating temperature, $T_{high}$ is a temperature at a highest epitaxial growth temperature, $\alpha_f(T)$ is a thermal expansion coefficient of the semiconductor layer at a temperature T, $\alpha_c(T)$ is a thermal expansion coefficient of the composite substrate at a temperature T and dT is the difference between $T_{low}$ and $T_{high}$, and wherein $\alpha_c(T)$ is chosen to minimize σ;

fabricating the composite substrate including the plurality of substrate layers, wherein a portion of the composite substrate includes a laminate structure of substrate layers each formed of a same material that is symmetric about a mid-plane of the composite substrate; and epitaxially growing the semiconductor layer on the composite substrate.

9. The method of claim 8, further comprising fabricating the device using the heterostructure.

10. The method of claim 8, wherein the device is one of: an emitting device or a transistor.

11. The method of claim 8, wherein the fabricating the composite substrate includes rigidly connecting the plurality of substrate layers in a sequential manner.

12. The method of claim 11, wherein the rigidly connecting includes bonding two substrate layers in the plurality of substrate layers to one another.

13. The method of claim 11, wherein the rigidly connecting includes at least one of: roughening or etching a surface of at least one of the plurality of substrate layers.

14. The method of claim 8, wherein the composite thermal expansion coefficient for the composite substrate is configured to substantially match a temperature averaged thermal expansion coefficient of the semiconductor film.

15. A heterostructure including:

a composite substrate including a plurality of substrate layers, wherein the plurality of substrate layers includes a first substrate layer formed of a first material having a first thermal expansion coefficient and a second substrate layer formed of a second material having a second thermal expansion coefficient different from the first thermal expansion coefficient, wherein a relative thickness of each of the plurality of substrate layers meets the following:

$$\sum_i E_i h_i \alpha_c - \sum_i E_i h_i \alpha_i = 0 \to \alpha_c = \frac{\sum_i E_i h_i \alpha_i}{\sum_i E_i h_i},$$

wherein $E_i$ is a biaxial modulus of a substrate layer, $h_i$ is a thickness of a substrate layer, $a_i$ is the thermal expansion coefficient for a substrate layer, and $a_c$ is a composite thermal expansion coefficient for the composite substrate;

a bonding material attaching at least the first substrate layer to the second substrate layer, wherein the bonding material has a refractive index that is one of: a match with the refractive index of the first substrate layer or the refractive index of the second substrate layer or between the refractive indexes of the first substrate layer and the second substrate layer, and a semiconductor layer having a third thermal expansion coefficient on the composite substrate epitaxially grown directly on the composite substrate, wherein the third thermal expansion coefficient is greater than or equal to the first thermal expansion coefficient and smaller than or equal to the second thermal expansion coefficient and wherein the composite thermal expansion coefficient for the composite substrate substantially matches a temperature averaged thermal expansion coefficient of the semiconductor film, wherein the composite thermal expansion coefficient for the composite substrate meets the following:

$$\sigma = E(\int_{T_{high}}^{T_{low}} [\alpha_f(T) - \alpha_c(T)] dT), \text{wherin}$$

σis the tensile stress, E is the biaxial modulus of the composite substrate, $T_{low}$ is a temperature measured at a room or an operating temperature, $T_{high}$ is a temperature at a highest epitaxial growth temperature, $\alpha_f(T)$ is a thermal expansion coefficient of the semiconductor layer at a temperature T, $\alpha_c(T)$ is a thermal expansion coefficient of the composite substrate at a temperature T and dT is the difference between $T_{low}$ and $T_{high}$, and wherein $\alpha_c(T)$ is chosen to minimize σ.

16. The heterostructure of claim 15, wherein the plurality of substrate layers are rigidly connected in a serial manner by the bonding material.

17. The heterostructure of claim 15, wherein a bonded surface of at least one of the substrate layers is non-uniform.

18. The heterostructure of claim 15, wherein the composite substrate includes a silicon carbide substrate layer and a sapphire substrate layer.

19. The heterostructure of claim 18, wherein the semiconductor layer is aluminum nitride.

* * * * *